United States Patent
Gambino et al.

(10) Patent No.: US 6,236,077 B1
(45) Date of Patent: May 22, 2001

(54) TRENCH ELECTRODE WITH INTERMEDIATE CONDUCTIVE BARRIER LAYER

(75) Inventors: Jeffrey P. Gambino, Gaylordsville, CT (US); Rajarao Jammy, Wappingers Falls, NY (US); Jack A. Mandelman, Stormville, NY (US); Carl J. Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/295,136

(22) Filed: Apr. 20, 1999

(51) Int. Cl.[7] .................... H01L 27/108; H01L 29/76; H01L 29/94; H01L 31/119
(52) U.S. Cl. ............................ 257/301; 257/305
(58) Field of Search .................. 257/295–310; 438/243–253, 396–399

(56) References Cited

U.S. PATENT DOCUMENTS

| | | | |
|---|---|---|---|
| 5,051,786 | 9/1991 | Nicollian et al. | 357/4 |
| 5,066,615 | 11/1991 | Brady et al. | 437/229 |
| 5,194,397 | 3/1993 | Cook et al. | 437/31 |
| 5,283,453 | 2/1994 | Rajeevakumar | 257/304 |
| 5,395,786 | 3/1995 | Hsu et al. | 437/52 |
| 5,434,109 | 7/1995 | Geissler et al. | 437/239 |
| 5,487,923 | 1/1996 | Min et al. | 427/569 |
| 5,489,544 | 2/1996 | Rajeevakumar | 437/52 |
| 5,512,767 | 4/1996 | Noble, Jr. | 257/301 |
| 5,576,566 | 11/1996 | Kenney | 257/301 |
| 5,648,861 | 7/1997 | Natsuhori | 349/116 |
| 5,656,535 | 8/1997 | Ho et al. | 438/386 |
| 5,677,219 | 10/1997 | Mazue et al. | 437/52 |
| 5,717,628 | * 2/1998 | Hammerl et al. | 257/301 |
| 5,796,166 | 8/1998 | Agnello et al. | 257/751 |
| 6,034,390 | * 3/2000 | Tows | 257/301 |

OTHER PUBLICATIONS

Fundamentals of Semiconductor Processing Technologies: by B. El–Kareh, Kluwer Academic Publishers, (1995), p. 534–546.

* cited by examiner

Primary Examiner—Tom Thomas
Assistant Examiner—Cuong Q. Nguyen
(74) Attorney, Agent, or Firm—Steve Capella

(57) ABSTRACT

Reduced scale trench capacitor structures of improved reliability and decreased series resistance are enabled by the creation and use of conductive barrier layers at intermediate points in the trench electrode structure. The conductive barrier layer is preferably either an intrinsically conductive compound barrier or a quantum conductive barrier. The capacitor structures are preferably characterized by a lower electrode region of very high dopant concentration.

14 Claims, 2 Drawing Sheets

TRENCH ELECTRODE WITH INTERMEDIATE CONDUCTIVE BARRIER LAYER

BACKGROUND OF THE INVENTION

In construction of microelectronic devices, it is well known that there is a constant pressure for reduction of device size and/or increase of device capability at a given scale.

In the actual construction of reduced scale devices, attention must be paid to higher precision in configuring the materials from which the device components are formed. Attention must also be paid to the interaction of the various materials used in device construction during the device manufacture process, during device testing, and during device operation. In this regard, finer sized device components are more sensitive to adverse materials interactions since the amount of material forming the component is smaller. For example, an interaction that might have only affected the border area of a large component would affect an entire component of smaller scale (e.g., where the scale of the smaller component is the same size as the border area of the larger component). Thus, reduction in component scale forces consideration of materials interaction problems which could have been viewed as non-critical for larger scale components.

In the context of devices such as deep trench capacitors in semiconductor substrates, various materials are used to form the components of the capacitor such as the capacitor plates (electrodes), the dielectric barrier between electrodes, oxide collar structures to prevent or minimize parasitic effects, surface or buried straps to provide contact between the capacitor and the other circuitry of the device, etc. For example, the electrode in the trench is typically a highly doped polycrystalline silicon (polysilicon) material, the buried or surface strap is typically an amorphous silicon, and the semiconductor substrate is a monocrystalline silicon. The successful functioning of the capacitor depends in part on the ability of these diverse materials to maintain their original or desirably modified character during manufacture/ useful life of the device.

Unfortunately, the nature of these materials is such that unwanted interactions may occur unless otherwise prevented. For example, the dopant in the polysilicon electrode may diffuse out into the monocrystalline silicon to an undesirable degree leading to compromise of the device performance (e.g., a deep junction effect). This constraint limits the amount of doping that can be employed in the trench electrode which in turn may itself limit the performance of the capacitor (e.g., increased series resistance, decreased charge storage capacity, etc.).

Furthermore, as the minimum lithographically definable feature size, F, is reduced with each successive generation of DRAM product, the cross-sectional area of the storage trench capacitor rapidly decreases. Since the series resistance/per unit depth of the conductive fill of the storage trench capacitor increases as $1/F^2$, it is critical to memory cell performance that ways to reduce the resistivity of the trench capacitor fill material be sought. Such reduction in series resistance must also be compatible with the other portions of the memory cell (i.e. must be able to withstand processing conditions without deterioration or contamination to other portions).

Thus, there is a desire for improved trench electrode structures which allow better control of materials interactions to enable construction of reliable reduced scale devices. It is also desired to meet these needs in an economical manner that minimizes or avoids compromise of other device or component properties.

SUMMARY OF THE INVENTION

The invention provides technology which enables reduced scale trench capacitor structures of improved reliability and performance. More specifically, the invention enables decreased trench electrode resistivity by incorporation of a conductive barrier layer at an intermediate level of the trench electrode structure. The conductive barrier layer is preferably either an intrinsically conductive compound barrier or a quantum conductive barrier.

In one aspect, the invention encompasses a deep trench capacitor in a monocrystalline semiconductor substrate, the capacitor comprising (i) a buried plate in the substrate about an exterior portion of a trench in the substrate, (ii) a node dielectric about at least a lower interior portion of the trench, (iii) an oxide collar about an upper interior portion of the trench, (iv) an electrode in the trench, the electrode comprising a lower region extending from the lower edge of collar (or located below the collar oxide lower edge) to node dielectric about the bottom of the trench and an intermediate electrode region extending upward from the lower electrode region, and (v) a conductive strap extending away from the trench electrode intermediate region, the conductive strap being electrically connected to the trench electrode and the monocrystalline substrate, the capacitor further comprising (vi) a conductive barrier layer between the lower and intermediate regions of the trench electrode. The conductive barrier layer is preferably either an intrinsically conductive compound barrier or a quantum conductive barrier.

In another aspect, the invention encompasses a method of forming a deep trench capacitor in a monocrystalline semiconductor substrate, the method comprising:
(a) providing a monocrystalline semiconductor substrate having (i) a buried plate in an exterior portion of a trench in the substrate, (ii) a node dielectric about at least a lower interior portion of the trench, and (iii) a lower electrode region having an exposed surface and (iv) and oxide collar about an upper interior portion of the trench,
(b) reacting surface of the lower electrode region with a nitrogen compound to form a quantum conductive layer on the exposed electrode surface, and
(c) filling the trench over the quantum conductive layer with a conductive electrode material to form an intermediate electrode region, and
(d) providing a conductive strap electrically connected to and extending away from the intermediate electrode region.

Alternatively, step (b) may be replaced with other techniques for forming quantum conductive layers. Preferred quantum conductive layers are silicon nitride compounds such as silicon nitride or silicon oxynitride. The invention also encompasses methods where the collar oxide is formed after the formation of the quantum conductive layer on the surface of the lower electrode region.

In further aspect, the invention encompasses a method of forming a deep trench capacitor in a monocrystalline semiconductor substrate, the method comprising:
(a) providing a monocrystalline semiconductor substrate having (i) a buried plate in an exterior portion of a trench in the substrate, (ii) a node dielectric about at least a lower interior portion of the trench, and (iii) a lower electrode region having an exposed surface and (iv) and oxide collar about an upper interior portion of the trench,
(b) forming a layer of said intrinsically conductive barrier material on the exposed electrode surface, and (c) filling the trench over the intrinsically conductive barrier layer with a conductive electrode material to form an intermediate electrode region, and (d) providing a conductive strap electrically connected to and extending away from the intermediate electrode region.

The intrinsically conductive barrier material is preferably formed by chemical vapor deposition, physical vapor deposition and/or sputtering. Preferred intrinsically conductive layers are transition metal nitrides or transition metal silicon nitrides.

The invention also encompasses methods where the collar oxide is formed after the formation of the intrinsically conductive layer on the surface of the lower electrode region.

These and other aspects of the invention are described in further detail below.

DETAILED DESCRIPTION OF THE INVENTION

The invention provides trench capacitor structures containing conductive barrier layers (useful to control dopant migration) between intermediate and lower regions of the trench electrode. The lower electrode region is preferably a very highly doped material. The invention further provides methods of forming the trench capacitor structures containing the conductive barrier layer of the invention.

The invention encompasses trench capacitor structures having the conductive barrier layer of the invention located at an interface between lower and intermediate regions of the trench electrode at or below the lower edge of the collar oxide. Otherwise, the invention is not limited to any specific trench capacitor structure. Examples of typical trench capacitor structures are shown in U.S. Pat. Nos. 5,283,453; 5,395,786; 5,434,109; 5,489,544; 5,512,767; 5,576,566; 5,656,535; and 5,677,219, the disclosures of which are incorporated herein by reference.

Figure 1:
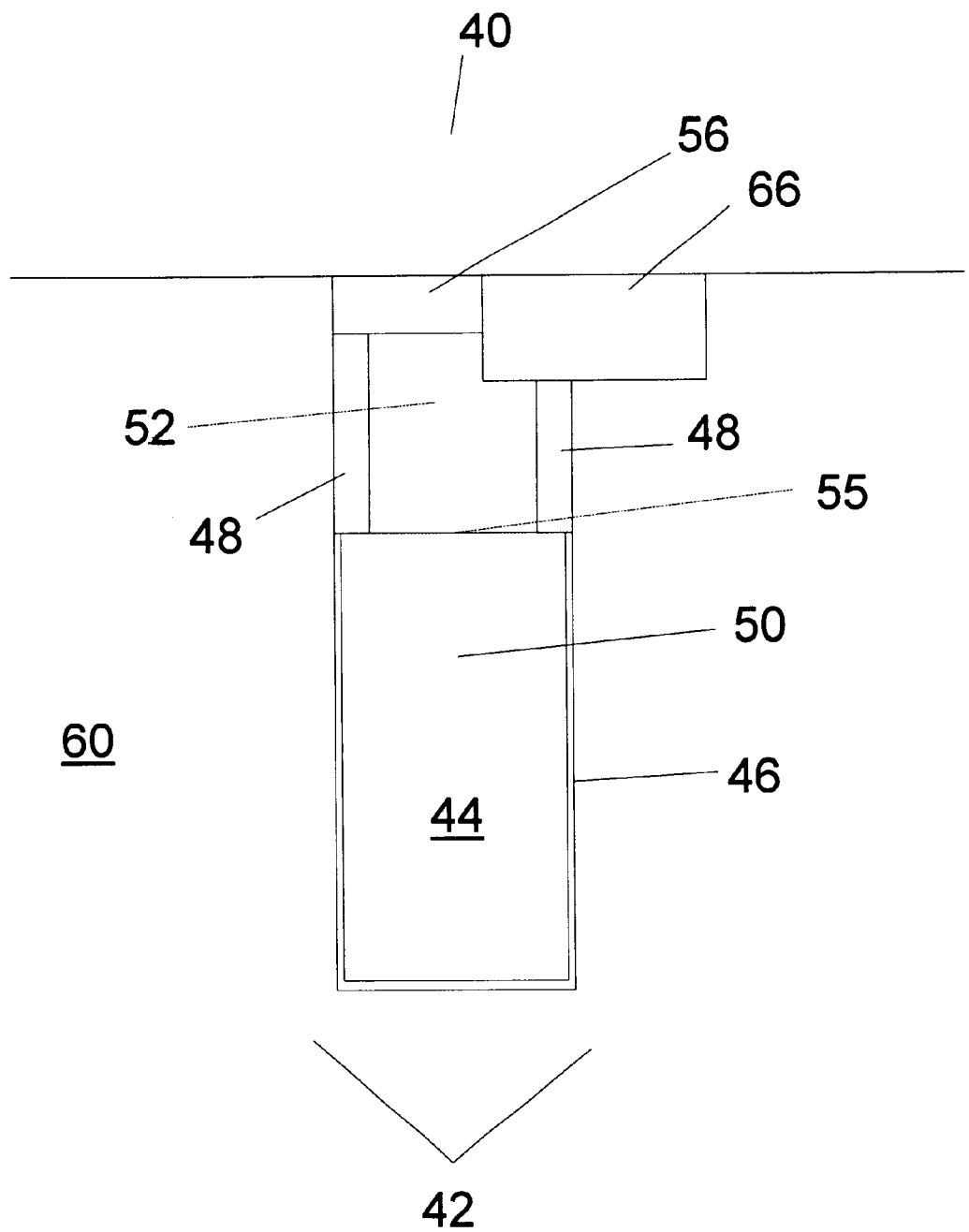
FIG. 1 is a schematic cross section of a deep trench capacitor structure illustrating a location for conductive barrier layer according to the invention, the cross section being parallel to the length of the buried strap.
Figure 2:
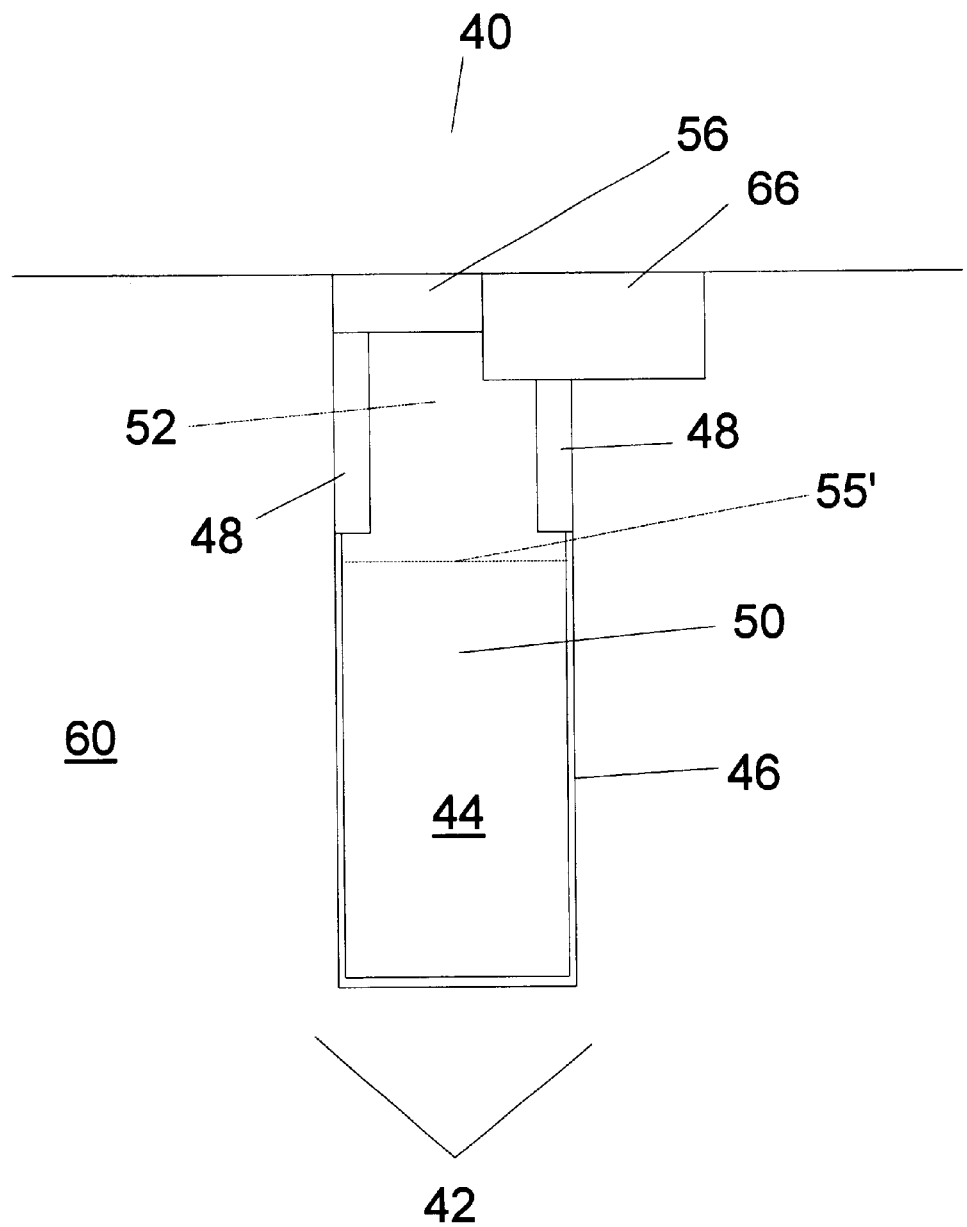
FIG. 2 is a schematic cross section of a deep trench capacitor structure illustrating an alternative location for conductive barrier layer according to the invention, the cross section being parallel to the length of the buried strap.

FIG. 1 shows a schematic side view of a typical trench capacitor 40 in a substrate 60. A buried plate electrode 42 is located about the exterior of a lower portion of the trench 44. A node dielectric 46 is present about the lower portion of the interior of trench 44. About the upper interior of trench 44 is an oxide collar 48. Shallow trench isolation (STI) 66 surrounds the top area of the capacitor on three sides. Trench 44 is filled with a conductive trench electrode material making up lower electrode region 50. An intermediate electrode region 52 resides above lower electrode region 50. A conductive strap 56 resides over and is electrically connected to intermediate electrode region 52. Strap 56 thus provides electrical access to capacitor 40. While FIGS. 1 and 2 show a buried strap, the trench capacitor may alternatively have a surface strap, lip strap (e.g., as disclosed in U.S. patent application Ser. No. 09/105739, filed on Jun. 26, 1998, the disclosure of which is incorporated herein by reference) or other strap configurations.

The conductive barrier layer of the invention is located at interface 55 between intermediate electrode region 52 and lower electrode region 50. The conductive barrier layer at 55 advantageously acts to prevent or inhibit diffusion of dopants from lower electrode region 50 to intermediate electrode region 52 and substrate 60. Thus, the conductive barrier layer enables the use of higher dopant concentrations in lower electrode region 50 and thereby enables reduction of the overall series resistance of the trench electrode.

The interface between the lower and intermediate electrode regions is preferably located at the lower edge of collar oxide 48, however, alternative locations of the interface below the collar oxide are also possible such as shown in FIG. 2 where interface 55' is below the collar oxide. The other features of the FIG. 2 structure are the same as those of FIG. 1.

If desired, the trench capacitor structures of the invention may contain conductive barrier layers at additional locations such as described in U.S. patent application Ser. No. 09/213,674, filed on Dec. 17, 1998, the disclosure of which is incorporated herein by reference.

The quantum conductive barrier layers of the invention are very thin films of materials which in their bulk properties would be considered dielectrics (i.e., electrical insulators). In very thin layers, however, these materials become electrically conductive. Advantageously, these thin layers also have the ability (a) to prevent or slow diffusion of chemical species from one side of the layer to the other. The bulk resistivity (measured in a thick section at 25° C.) of the materials used to make up the quantum conductive layers of the invention is preferably at least about $10^6$ ohm-m, more preferably at least about $10^8$ ohm-m, most preferably at least about $10^{11}$ ohm-m.

The quantum conductive barrier layer preferably has a thickness of about 50 Å or less, more preferably about 5–30 Å, most preferably about 5–15 Å. The resulting layers preferably have a film resistance of less than about 1 K-ohm-$\mu m^2$, more preferably less than about 100 ohm-$\mu m^2$. The series resistance introduced by the quantum conductive layer is equal to the film resistance (ohm-$\mu m^2$) divided by the cross-sectional area ($\mu m^2$) of the quantum conductive layer normal to the direction of current.

The quantum conductive barrier layers of the invention are preferably substantially uniform, however some variation in thickness may be permissible. Preferably, the layer thickness is kept in a range permitting the quantum conductive effect to take place for all points on the layer while performing the desired barrier function.

Preferred quantum conductive materials are inorganic oxides or nitrides, more preferably silicon nitride compounds selected from the group consisting of silicon nitride or silicon oxynitride. These compounds may be stoichiometric or non-stoichiometric. Alternatively, other ceramic materials, such as, for example, alumina, germanium oxide, yttria-stabilized zirconia or other forms of zirconia may be used. The layer composition may be determined by secondary ion mass spectroscopy (SIMS) or other suitable technique.

The intrinsically conductive compound barrier material preferably has a bulk resistivity of less than about $10^{-1}$ ohm-m, more preferably about $10^{-6}$–$10^{-4}$ ohm-m. The intrinsically conductive barrier material is preferably a transition metal compound containing at least one element that is neither metallic nor metalloid. More preferably, the intrinsically conductive barrier material is a nitrogen-containing group IV(b)–VI(b) transition metal compound. Preferred transition metals are titanium or tungsten. Preferred intrinsically conductive materials are selected from the group consisting of transition metal nitrides and transition metal silicon nitrides.

The thickness of the intrinsically conductive barrier layer may be varied as long as the desired barrier function is obtained. Preferably, the intrinsically conductive barrier layer has a thickness of at least about 50 Å, more preferably at least about 100 Å, most preferably about 100–500 Å.

The intrinsically conductive barrier layer(s) preferably has a film resistance of less than about 1 K-ohm-$\mu$m$^2$, more preferably less than about 100 ohm-$\mu$m$^2$. The series resistance introduced by the intrinsically conductive barrier layer is equal to the film resistance (ohm-$\mu$m$^2$) divided by the cross sectional area ($\mu$m$^2$) of the intrinsically conductive barrier layer normal to the direction of current.

The invention is not limited to any specific material compositions for the various components of the trench capacitor. If desired, any of various materials described in the art may be used. Thus, the trench electrode regions 50 and 52 would typically be made of a doped polycrystalline silicon. Strap 56 would typically be made of amorphous silicon. Substrate 60 would typically be a monocrystalline semiconductor material (most typically silicon, lightly doped silicon or silicon having lightly doped bands). The buried strap 42 is typically a high dopant (e.g., arsenic) region within the substrate. The collar 48 is typically a silicon dioxide.

The presence of the conductive barrier region at interface 55 (or 55') advantageously enables the use of higher dopant concentrations in lower electrode region 50 compared to intermediate electrode region 52. For example, lower region 50 may have very high dopant levels (e.g., 5×10$^{18}$–10$^{21}$, more preferably 5×10$^{19}$–10$^{20}$ dopant atoms per cm$^3$).

Trench capacitor structures containing the conductive barrier layers of the invention may be formed by inserting a conductive barrier layer formation step at an appropriate point(s) in the overall capacitor manufacturing process. The overall trench capacitor manufacturing process used may be any of those known in the art such as those described in the patents mentioned above. Alternatively, other variations on trench capacitor manufacturing processes may also be used (e.g., processes involving formation of collar oxides by the LOCOS technique).

In one embodiment, the trench capacitor of the invention may be formed in a monocrystalline semiconductor substrate by a method comprising:
(a) providing a monocrystalline semiconductor substrate having (i) a buried plate in an exterior portion of a trench in the substrate, (ii) a node dielectric about at least a lower interior portion of the trench, and (iii) a lower electrode region having an exposed surface and (iv) and oxide collar about an upper interior portion of the trench,
(b) forming a conductive barrier layer on the exposed electrode surface, and
(c) filling the trench over the conductive barrier layer with a conductive electrode material to form an intermediate electrode region, and
(d) providing a conductive strap electrically connected to and extending away from the intermediate electrode region.

Where the conductive barrier layer is a quantum conductive barrier, the quantum conductive barrier layers may be formed by various methods. The choice of method may depend on the composition of the surface on which the layer is to be formed and/or the desired quantum conductive layer composition.

Where the surface on which the layer is to be formed has a high silicon content (e.g., a conventional (doped or undoped) polycrystalline, amorphous or monocrystalline silicon), the quantum conductive layer is preferably formed by reacting a portion of the silicon at the lower electrode surface with a nitrogen-containing compound in the atmosphere contacting the surface. Preferred nitrogen-containing compounds are those which are easily handled in a gaseous state. Examples of preferred nitrogen compounds are selected from the group consisting of ammonia, NO, N$_2$O or (under plasma conditions) monatomic nitrogen. Ammonia is the preferred nitrogen compound. The atmosphere may also contain one or more diluent gases such as N$_2$, helium or argon. The partial pressure of the nitrogen compound is preferably about 1–760 Torr, more preferably, about 5–10 Torr. The reaction is typically facilitated by heating to a temperature of about 300–950° C., more preferably about 350–750° C. The reaction may be conducted until the desired layer thickness is formed. Preferably, the reaction is conducted for about 1–30 minutes, more preferably about 10–20 minutes. The reaction is typically self-limiting under these conditions.

If desired, the lower electrode surface may be pre-cleaned by a chemical etch (e.g., HF solution) and/or by a high temperature (e.g., about 900°–1000° C.) bake in a hydrogen atmosphere (or other appropriate reducing atmosphere) to remove some or all of any pre-existing oxide surface layer. The techniques described in U.S. Pat. No. 5,194,397 may also be used to control the presence of oxide film. Other known methods for removal of residual films may also be used where appropriate.

Where an oxynitride quantum conductive barrier layer is desired, the above nitrogen reaction process may be conducted with a substrate having a pre-existing very thin oxide layer. In such instances, the relative contents of oxygen and nitrogen in the quantum conductive layer can be controlled by the temperature and time of the nitrogen compound reaction, with higher temperatures and longer reaction times giving a more nitrogen-rich layer. Alternatively, if desired, oxynitride layers may be formed by introducing a very minor amount of oxygen into the nitrogen compound-containing atmosphere. In general, this method is less preferred since control of the oxygen content and/or layer thickness may be difficult.

Where reaction of the underlying surface is not desired or not practical, the quantum conductive layer may be formed by chemical vapor deposition. In such instances, the reactants for forming the quantum conductive layer may be those typically used to form a layer of the corresponding dielectric material, however the reaction conditions (time, temperature, pressure) and/or proportions of the reactants must be appropriately reduced to avoid deposition of an excessively thick film. See, for example, the process for forming germanium oxide thin films described in U.S. Pat. Nos. 5,648,861 and 5,051,786, the disclosures of which are incorporated herein by reference. Alternative methods for forming the desired films may be found in the "Handbook of Thin Film Technology" by Maissel & Glang, McGraw-Hill Book Co. (1970) and in similar treatises.

Appropriate etching techniques may be used to reduce excess film thickness where necessary and/or to remove quantum conductive material deposited on the collar oxide surface if desired.

Where the conductive barrier layer is an intrinsically conductive barrier, the intrinsically conductive barrier layer may be made by various methods depending on the composition of the surface on which the layer is to be formed and/or the desired intrinsically conductive barrier layer composition.

Where the surface on which the layer is to be formed has a high silicon content (e.g., a conventional (doped or undoped) polycrystalline, amorphous or monocrystalline silicon) and a silicon-containing intrinsically conductive barrier is desired, the intrinsically conductive barrier layer may be formed by reacting a portion of the silicon at the immediate surface with a nitrogen-containing compound in the atmosphere contacting the surface to form a silicon nitride layer (e.g., about 10 nm thick). A transition metal is then deposited on the silicon nitride layer and reacted with the silicon nitride layer to form the desired transition metal silicon nitride material.

Preferred nitrogen-containing compounds are those which are easily handled in a gaseous state. Examples of preferred nitrogen compounds are selected from the group consisting of ammonia, NO, $N_2O$ or (under plasma conditions) monatomic nitrogen. Ammonia is the most preferred nitrogen compound. The atmosphere may also contain one or more diluent gases such as $N_2$, helium or argon. The partial pressure of the nitrogen compound is preferably about 1–760 Torr, more preferably about 5–10 Torr. The reaction is typically facilitated by heating to a temperature of about 300–950° C., more preferably about 350–750° C. The reaction may be conducted until the desired layer thickness is formed. Preferably, the reaction is conducted for about 1–30 minutes, more preferably about 10–20 minutes.

The transition metal may be deposited for reaction using one of the deposition techniques mentioned below. The reaction to form the transition metal silicon nitride is preferably carried out at about 800–100° C. for about 10 seconds to 5 minutes in an inert ambient (e.g., $N_2$).

Alternatively, the intrinsically conductive barrier layer may be formed by chemical vapor deposition, plasma enhanced chemical vapor deposition, physical vapor deposition, collimated or non-collimated sputtering or other depostion technique. In such instances, the reactants for forming the intrinsically conductive barrier layer may be those typically used to form thin film layers of the desired material. Various methods for forming the desired thin films may be found in the "Fundamentals of Semiconductor Processing Technologies" by Badih El-Kareh, Kluwer Academic Press, (1995), especially Chapter 3, and in "Handbook of Thin Film Technology" by Maissel & Glang, McGraw-Hill Book Co. (1970) as well as in similar treatises. Examples of suitable layer formation processes are disclosed in U.S. Pat. Nos. 5,066,615; 5,487,923; and 5,796,166 the disclosures of which are incorporated herein by reference.

In the formation of metal silicon nitride barrier layers, preferred silicon reactant precursors are silane and dichlorosilane. Preferred transition metal reactant precursors are transition metal chlorides or fluorides.

Appropriate etching techniques may be used to reduce excess film thickness where necessary and/or to remove intrinsically conductive material deposited on the collar oxide surface if desired.

In some instances, it may be possible to form the conductive barrier layer prior to formation of the collar oxide. For example, where the interface between the lower and intermediate electrode regions is to be located below the lower edge of the collar oxide, the conductive barrier layer may be formed prior to formation of the collar oxide. The process could then be completed by filling the intermediate electrode region with the desired intermediate electrode material, followed by etch-back of the intermediate electrode material to a point where the collar oxide is to be located, but not to the point of exposing the conductive barrier layer. The collar oxide could then be formed using conventional techniques and the intermediate region of the trench refilled with the appropriate electrode material. The appropriate strap formation steps would preferably follow to complete the desired structure.

Other process variations may be used to form the capacitor structures of the invention as may be apparent to those skilled in the art.

What is claimed is:

1. A deep trench capacitor in a monocrystalline semiconductor substrate, the capacitor comprising (i) a buried plate in the substrate about an exterior portion of a trench in the substrate, (ii) a node dielectric about at least a lower interior portion of the trench, (iii) an oxide collar about an upper interior portion of the trench, (iv) an electrode in the trench, the electrode comprising a lower region at or below a lower edge of said collar and extending to said node dielectric and an intermediate electrode region extending upward from the lower electrode region, and (v) a conductive strap extending away from the trench electrode intermediate region, the conductive strap being electrically connected to the trench electrode and the monocrystalline substrate, the capacitor further comprising (vi) a conductive barrier layer between the lower and intermediate regions of the trench electrode.

2. The capacitor of claim 1 wherein said conductive barrier layer is a quantum conductive barrier layer consisting of a material selected from the group consisting of silicon nitride, silicon oxynitride, alumina, germanium oxide and yttria-stabilized zirconia.

3. The capacitor of claim 2 wherein said quantum conductive barrier layer consists of a material selected from the group consisting of silicon nitride, silicon oxynitride.

4. The capacitor of claim 2 wherein said quantum conductive layer has a thickness of less than about 50 Å.

5. The capacitor of claim 2 wherein said quantum conductive layer has a thickness of about 5–30 Å.

6. The capacitor of claim 1 wherein said lower electrode region extends from said lower edge of said collar oxide.

7. The capacitor of claim 1 wherein said conductive barrier layer is located below said lower edge of said collar oxide.

8. The capacitor of claim 1 wherein said lower and intermediate electrode regions consist of doped polycrystalline silicon.

9. The capacitor of claim 8 wherein said intermediate electrode region has a lower dopant concentration than said lower electrode region.

10. The capacitor of claim 8 wherein said lower electrode region has a dopant concentration of at least about $5 \times 10^{18}$ dopant atoms per $cm^3$.

11. The capacitor of claim 10 wherein said lower electrode region has a dopant concentration of about $5 \times 10^{19}$ to $10^{21}$ dopant atoms per $cm^3$.

12. The capacitor of claim 1 wherein said conductive barrier layer is an intrinsically conductive barrier layer selected from the group consisting of transition metal nitrides and transition metal silicon nitrides.

13. The capacitor of claim 12 wherein said intrinsically conductive barrier layer has a thickness of at least about 50 Å.

14. The capacitor of claim 12 wherein said intrinsically conductive barrier layer has a thickness of about 100–500 Å.

* * * * *